(12) United States Patent
Schulze zur Wiesche

(10) Patent No.: US 11,142,138 B1
(45) Date of Patent: Oct. 12, 2021

(54) PRINTED CIRCUIT BOARD AND LIGHT GUIDE FOR ELECTRONICS ASSEMBLY

(71) Applicant: Dura Operating, LLC, Auburn Hills, MI (US)

(72) Inventor: Jochen Schulze zur Wiesche, Cologne (DE)

(73) Assignee: DUS Operating Inc., Auburn Hills, MI (US)

( * ) Notice: Subject to any disclaimer, the term of this patent is extended or adjusted under 35 U.S.C. 154(b) by 9 days.

(21) Appl. No.: 16/822,671

(22) Filed: Mar. 18, 2020

(51) Int. Cl.
| | |
|---|---|
| *H05K 7/00* | (2006.01) |
| *B60R 13/02* | (2006.01) |
| *F21V 8/00* | (2006.01) |
| *H05K 1/02* | (2006.01) |
| *H05K 5/06* | (2006.01) |
| *H05K 3/28* | (2006.01) |
| *B29C 45/14* | (2006.01) |
| *H01L 33/58* | (2010.01) |
| *H01L 33/60* | (2010.01) |
| *B29L 31/30* | (2006.01) |
| *B60R 13/00* | (2006.01) |

(52) U.S. Cl.
CPC .............. *B60R 13/02* (2013.01); *B29C 45/14* (2013.01); *G02B 6/006* (2013.01); *G02B 6/0065* (2013.01); *H01L 33/58* (2013.01); *H01L 33/60* (2013.01); *H05K 1/0274* (2013.01); *H05K 3/284* (2013.01); *H05K 5/065* (2013.01); *B29K 2995/0026* (2013.01); *B29L 2031/3041* (2013.01); *B60R 13/005* (2013.01); *B60R 2013/0287* (2013.01); *H05K 2201/10121* (2013.01); *H05K 2203/1316* (2013.01); *H05K 2203/1327* (2013.01)

(58) Field of Classification Search
USPC ............................................. 361/760
See application file for complete search history.

(56) References Cited

U.S. PATENT DOCUMENTS

| | | | |
|---|---|---|---|
| 9,869,810 B2 | 1/2018 | Keranen et al. | |
| 2011/0198026 A1 | 8/2011 | Gourlay | |
| 2016/0132113 A1* | 5/2016 | Hotchkiss | B60K 35/00 345/173 |
| 2020/0103093 A1* | 4/2020 | Negel | F21V 3/12 |

\* cited by examiner

*Primary Examiner* — Andargie M Aychillhum

(57) ABSTRACT

A trim panel assembly includes a printed foil extending for a first area, a printed circuit board disposed overtop the foil, the printed circuit board extending for a second area smaller than the first area, and a light guide disposed overtop the printed circuit board and having a perimeter. The perimeter is inset from the printed foil, and surrounds the printed circuit board, forming a sealed interface with the printed foil. At least a portion of the perimeter of the light guide is beveled. A reflector is disposed overtop the light guide. In an electronic assembly the reflector, the light guide, the printed circuit board, and the printed foil are disposed at least partially in a cavity of a molded support panel. The molded support panel is substantially planar, and a semi-transparent material is overmolded directly onto and overtop the electronic assembly and the molded support panel.

16 Claims, 5 Drawing Sheets

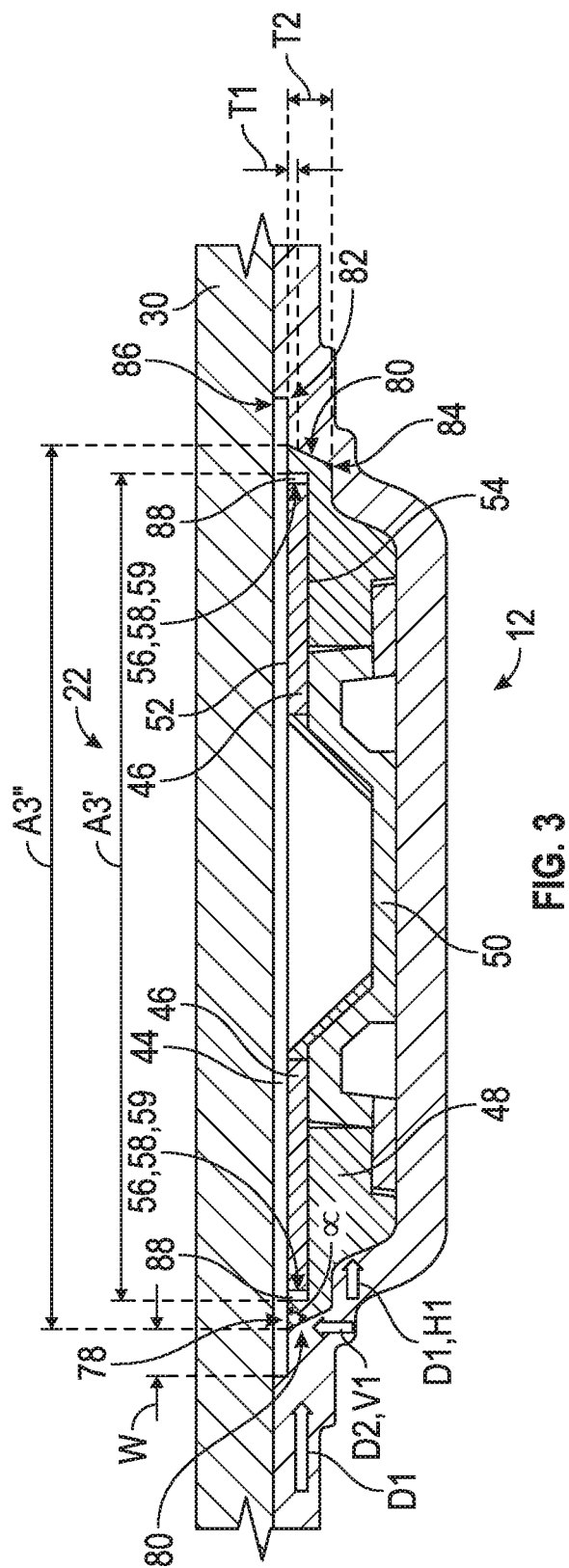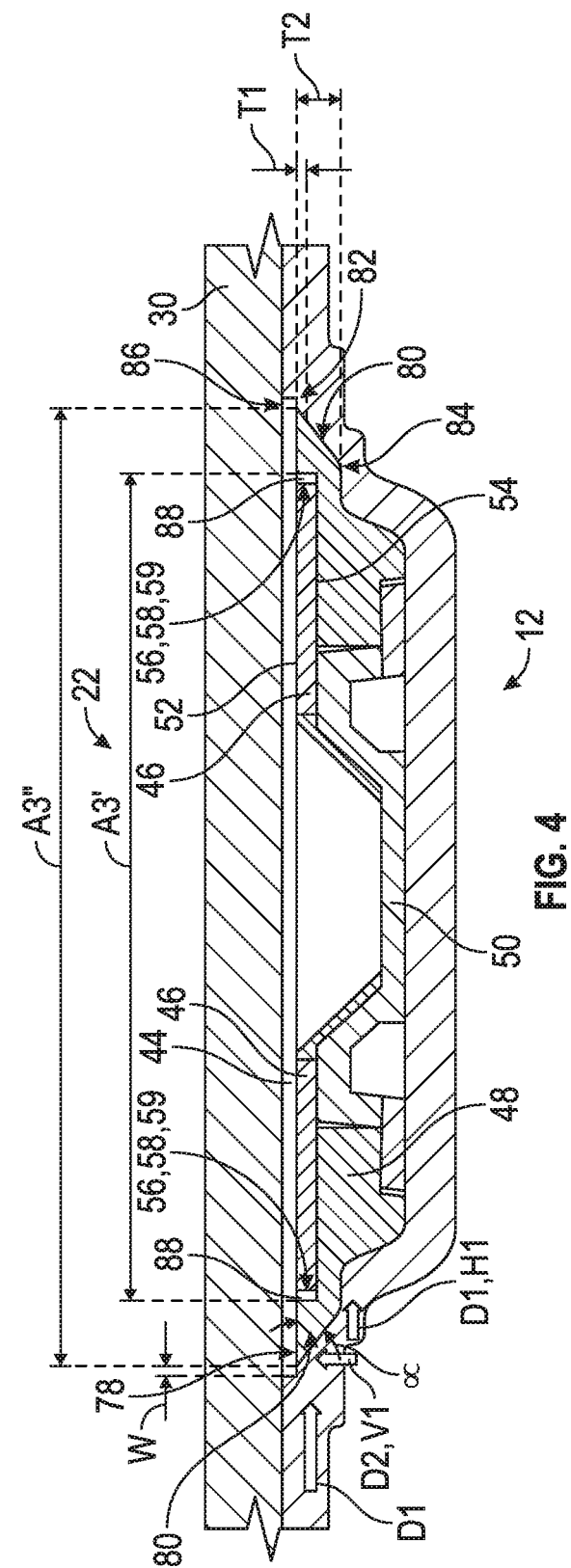

PRINTED CIRCUIT BOARD AND LIGHT GUIDE FOR ELECTRONICS ASSEMBLY

FIELD

The present disclosure is directed to an in-molded electronic assembly for a light guide.

BRIEF DESCRIPTION

The statements in this section merely provide background information related to the present disclosure and may or may not constitute prior art.

Electronic assemblies may include a number of electrical components, such as printed circuit boards and electrical components mounted to or associated with the printed circuit boards, such as capacitors, chipsets and light emitting diodes. In addition, printed circuit boards, and the associated electrical components, may be encapsulated or mounted in a polymer material to provide a housing, protection for the circuit board or to act as a light guide for light emitting sources associated with the printed circuit board. Further, these electronic assemblies may become a part of larger assemblies. For example, the electronic assemblies may be mounted into other assemblies, such as automotive trim components, through processes, such as in-mold assembly, that use thermal or mechanical energy.

The printed circuit boards, however, are often formed from materials that are dissimilar from the materials used to form the housing and trim components. Thus, the materials may exhibit different physical properties, such as volumetric expansion properties or compressive strength. These differing physical properties, and the method by which the electronic assembly is constructed may lead to the materials of the individual housing and trim components being displaced from their intended assembled locations.

Accordingly, while current electronic assemblies achieve their intended purpose, there is a need for a new and improved system and method for forming electronic assemblies.

SUMMARY

According to several aspects of the present disclosure a trim panel assembly includes a printed foil extending for a first area, and a printed circuit board disposed overtop the foil, the printed circuit board extending for a second area smaller than the first area. The trim panel assembly further includes a light guide disposed overtop the printed circuit board and having a perimeter. The perimeter of the light guide is inset from the printed foil, and the perimeter of the light guide surrounds the printed circuit board and forms a sealed interface with the printed foil. At least a portion of the perimeter of the light guide is beveled. A reflector is disposed overtop the light guide. In an electronic assembly the reflector, the light guide, the printed circuit board, and the printed foil are disposed at least partially in a cavity of a molded support panel. The molded support panel is substantially planar, and wherein a semi-transparent material is overmolded directly onto and overtop the electronic assembly and at least some of the molded support panel.

In another aspect of the present disclosure the semi-transparent material is overmolded in an injection direction.

In yet another aspect of the present disclosure the perimeter of the light guide has a beveled portion.

In yet another aspect of the present disclosure the beveled portion of the perimeter of the light guide faces towards the injection direction.

In yet another aspect of the present disclosure the beveled portion of the perimeter of the light guide defines a curvilinear cross-section extending from a lateral edge having a first thickness to an inboard shoulder having a second thickness greater than the first thickness.

In yet another aspect of the present disclosure the beveled portion of the perimeter of the light guide defines an angular cross-section extending from a lateral edge having a first thickness to an inboard shoulder having a second thickness greater than the first thickness.

In yet another aspect of the present disclosure the beveled portion of the perimeter of the light guide is inset from edges of the printed foil by a distance of at least one millimeter.

In yet another aspect of the present disclosure the light guide, the printed circuit board, and the printed foil define an air gap located at an outer edge of the printed circuit board.

In yet another aspect of the present disclosure when the semi-transparent material is overmolded onto the electronic assembly, the semi-transparent material is injected in a direction substantially parallel to the molded support panel and the beveled portion of the perimeter of the light guide generates force in a direction orthogonal to the molded support panel. The force creates the sealed interface between the light guide and the printed foil.

In yet another aspect of the present disclosure an angle of the beveled portion defines a quantity of the force generated by the light guide when the semi-transparent material is overmolded onto the electronic assembly.

In yet another aspect of the present disclosure a trim panel assembly includes a molded support panel, the molded support panel including an exterior surface and a cavity defined in the exterior surface. The trim panel assembly further includes an electronic assembly located in the cavity. The electronic assembly includes a printed foil extending for a first area, and a printed circuit board is disposed overtop the printed foil. The printed circuit board extends for a second area smaller than the first area. A light guide is disposed overtop the printed circuit board and having a perimeter. The perimeter of the light guide is inset from the printed foil, and the perimeter of the light guide surrounds the printed circuit board and forms a sealed interface with the printed foil. At least a portion of the perimeter of the light guide is beveled. A reflector disposed overtop the light guide. The molded support panel is substantially planar, and a semi-transparent material is overmolded directly onto and overtop the trim panel assembly and at least some of the molded support panel.

In yet another aspect of the present disclosure the semi-transparent material is overmolded in an injection direction.

In yet another aspect of the present disclosure the perimeter of the light guide includes a beveled portion. The beveled portion of the perimeter of the light guide faces towards the injection direction.

In yet another aspect of the present disclosure the beveled portion of the perimeter of the light guide defines one or more of a curvilinear cross-section and an angular cross-section.

In yet another aspect of the present disclosure the beveled portion of the perimeter of the light guide is inset from edges of the printed foil by a distance of at least one millimeter.

In yet another aspect of the present disclosure the light guide, the printed circuit board, and the printed foil define an air gap located at an outer edge of the printed circuit board.

In yet another aspect of the present disclosure when the semi-transparent material is overmolded onto the electronic assembly, the semi-transparent material is injected in a direction substantially parallel to the molded support panel and the beveled portion of the perimeter of the light guide generates force in a direction orthogonal to the molded support panel. The force creates the sealed interface between the light guide and the printed foil.

In yet another aspect of the present disclosure an angle of the beveled portion defines a quantity of the force generated by the light guide when the semi-transparent material is overmolded onto the electronic assembly.

In yet another aspect of the present disclosure a method of forming a trim panel assembly includes assembling an electronic assembly. The electronic assembly having a printed foil extending for a first area, a printed circuit board (PCB) disposed overtop the printed foil, the PCB extending for a second area smaller than the first area, a light guide disposed overtop the printed circuit board and having a perimeter. The perimeter of the light guide is inset from the printed foil, and the perimeter of the light guide surrounds the PCB and forms a sealed interface with the printed foil. At least a portion of the perimeter of the light guide is beveled, and a reflector disposed overtop the light guide. The method further includes arranging the electronic assembly within a cavity defined in an exterior surface of a molded support panel. The molded support panel is substantially planar. The method further includes overmolding a semi-transparent material directly onto and overtop the electronic assembly and at least some of the molded support panel. The semi-transparent material is overmolded in an injection direction. The beveled portion of the perimeter of the light guide is inset from edges of the printed foil by a distance of at least one millimeter. The light guide, the PCB, and the printed foil define an air gap located at an outer edge of the printed circuit board. The beveled portion of the perimeter of the light guide faces towards the injection direction and defines one or more of a curvilinear cross-section and an angular cross-section.

In yet another aspect of the present disclosure overmolding a semi-transparent material further includes injecting the semi-transparent material in a direction substantially parallel to the molded support panel. The method further includes causing the beveled portion of the perimeter of the light guide to generate force in a direction orthogonal to the molded support panel. The force creates the sealed interface between the light guide and the printed foil, and wherein an angle of the beveled portion defines a quantity of the force generated by the light guide when the semi-transparent material is overmolded onto the electronic assembly.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

FIG. 3 is a cross-sectional illustration of the trim panel assembly of FIG. 1 taken along line 3-3 according to an aspect of the present disclosure;

FIG. 4 is a cross-sectional illustration of a variation of the trim panel assembly of FIG. 1 taken along line 3-3 according to an aspect of the present disclosure;

DETAILED DESCRIPTION

Figure 1:
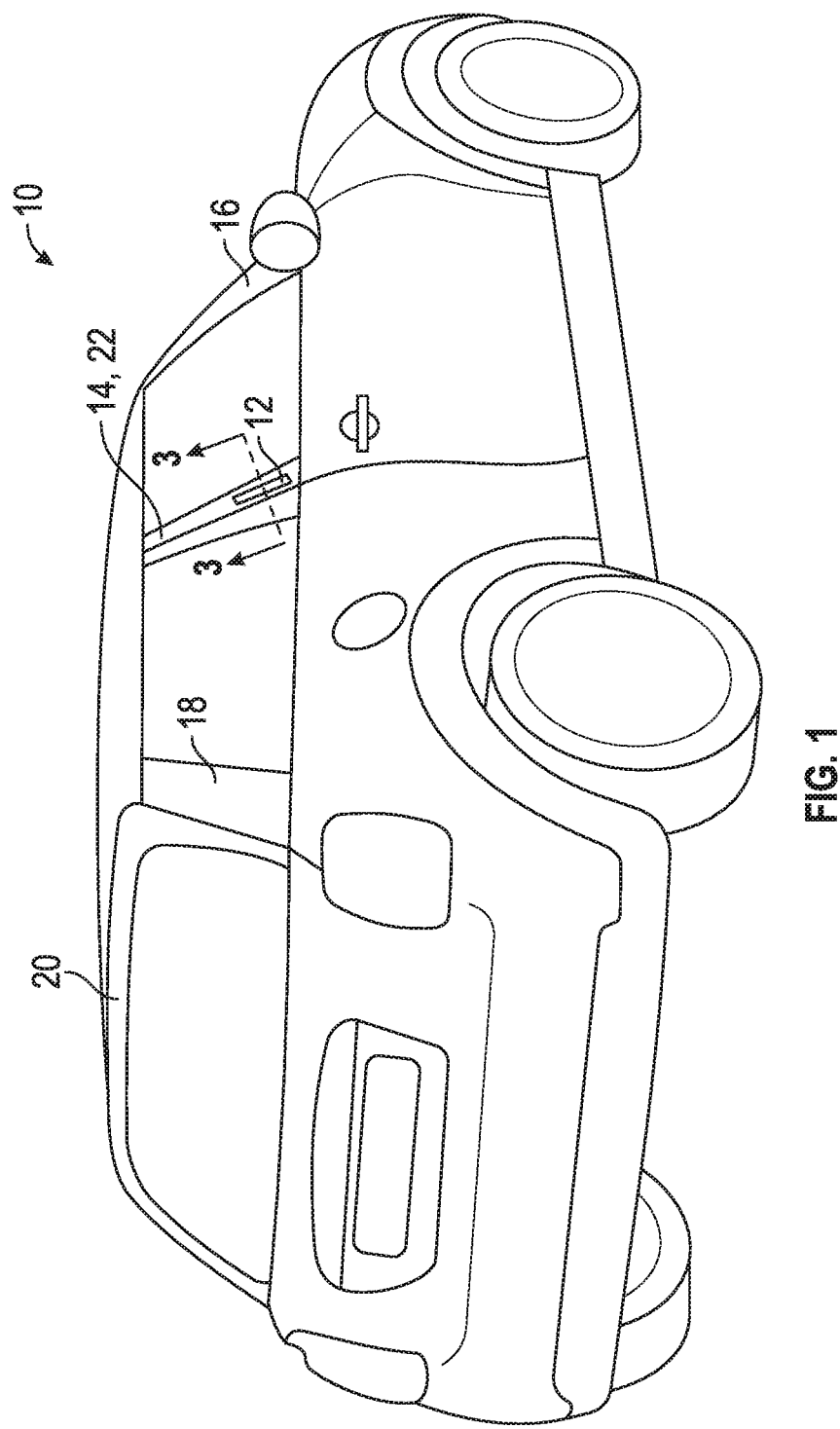
FIG. 1 is an illustration of a vehicle including a trim panel according to an aspect of the present disclosure.

The following description is merely exemplary in nature and is not intended to limit the present disclosure, application or uses.

The terms "exterior" and "interior" are terms used relative to the orientation of a vehicle 10 as shown in the drawings of the present application. Thus, "exterior" refers to the external portion of the vehicle and "interior" refers to the compartments within the body of the vehicle 10. The terms "first face", "second face", "lateral" and "longitudinal" are terms relative to the orientation of the printed circuit board as shown in the drawings of the present application. Thus, while the orientation of the printed circuit board as shown in the drawings may change with respect to a given use, these terms are intended to still apply relative to the orientation of the printed circuit board as shown in the drawings.

Electronic assemblies may be used as operator interfaces on vehicles. Such interfaces may be interactive, where a human can interact with the vehicle to, for example, unlock or lock vehicle doors, open a trunk or hatch, determine the level of battery charge or amount of fuel available, determine vehicle alarm status, etc. FIG. 1 illustrates an example of a vehicle 10 including an electronic assembly 12 integrated into a trim panel assembly 22 (see FIG. 2) that provides the B-pillar trim panel 14. As illustrated, the vehicle is an automobile; however, it may be appreciated that electronic assemblies may be integrated into other vehicles, such as but not limited to personal and commercial trucks, motorcycles, aviation vehicles including helicopters and airplanes, and watercraft including boats and personal watercraft. Further, while FIG. 1 illustrates the electronic assembly 12 integrated into the B-pillar trim panel 14, similar electronic assemblies 12 may be integrated into other exterior trim components, such as the A-pillar trim panel 16, C-pillar trim panel 18, or spoiler trim panel 20 as well as interior trim components without departing from the scope or intent of the present application.

Figure 2:
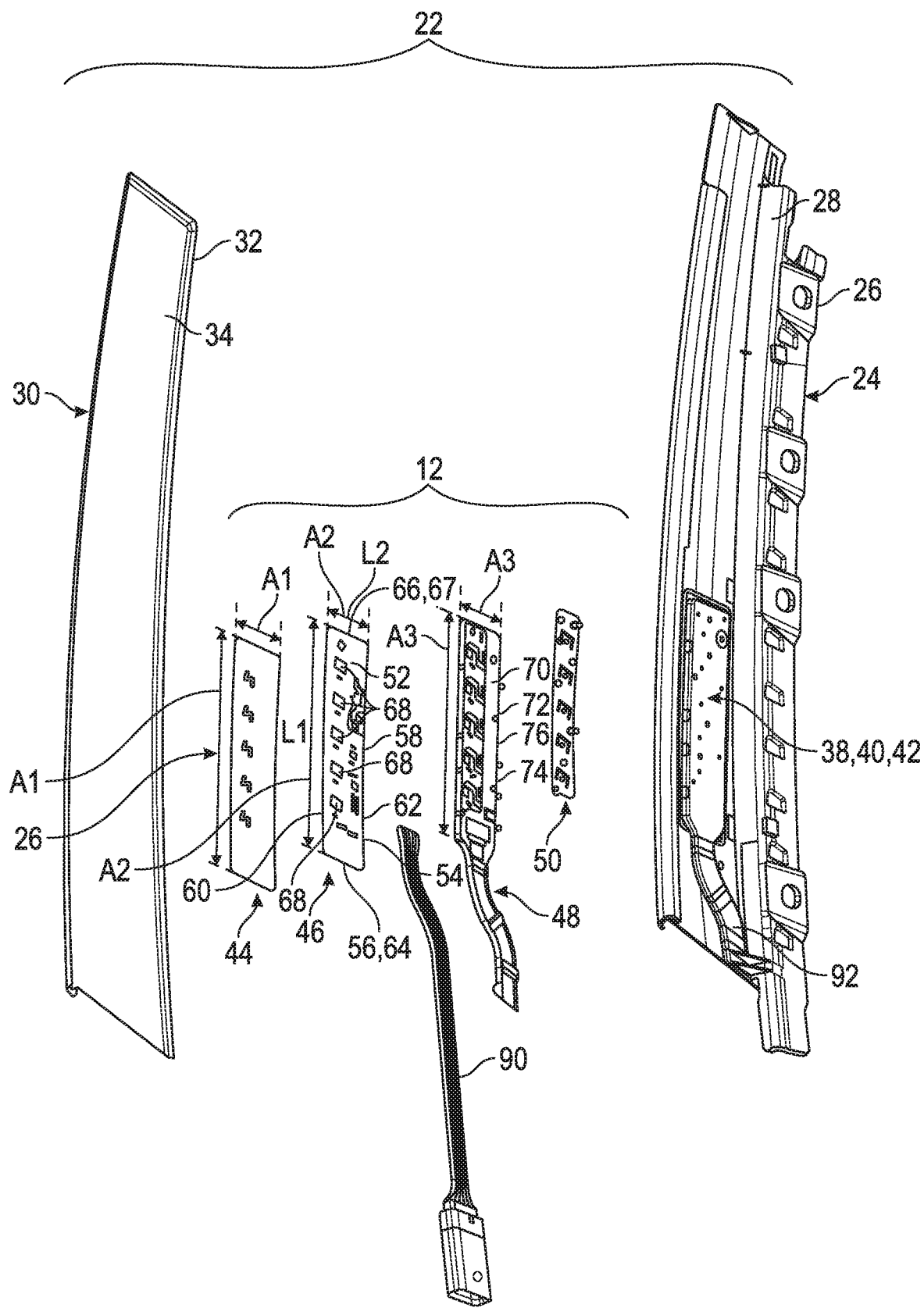
FIG. 2 is an exploded diagram of a trim panel assembly according to an aspect of the present disclosure.

An exploded view of a trim panel assembly 22 providing the B-pillar trim panel 14 is illustrated in FIG. 2. The trim panel assembly 22 is illustrated as being gently curved and oblong, however, the trim panel assembly 22 may assume any number of geometries without departing from the scope or intent of the present disclosure. The trim panel assembly 22 includes the electronic assembly 12 described further herein, a molded support panel 24, which includes an interior face 26 and an exterior surface 28, and a skin layer 30, which also includes an interior face 32 and an exterior surface 34. The molded support panel 24 is gently curved and oblong. The exterior surface 28 of the molded support panel 24 is, in some examples, substantially planar in shape. The term "substantially planar" is understood in the art, and means defining a plane, or deviating in only minor degrees from a plane. That is, the substantially planar molded support panel 24 defines or largely defines a planar or flattened shape.

Figure 5:
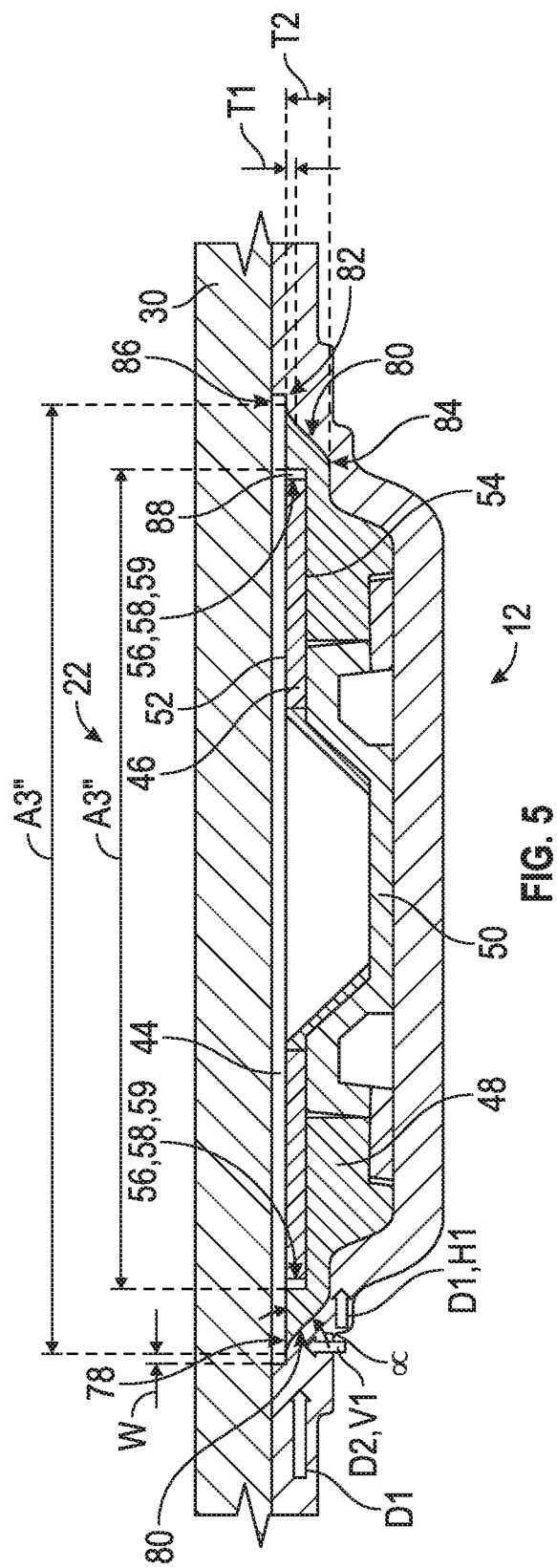
FIG. 5 is a cross-sectional illustration of a second variation of the trim panel assembly of FIG. 1 taken along line 3-3 according to an aspect of the present disclosure.

Turning now to FIGS. 3, 4, and 5 and with continuing reference to FIGS. 1 and 2, the molded support panel 24 is formed from a polymer material and, in some aspects, a thermoplastic polymer material such as acrylonitrile-butadiene-styrene (ABS), acrylonitrile styrene acrylate (ASA), polycarbonate, polyamide 6, polyethylene terephthalate, polybutylene terephthalate, co-polymers thereof, and blends thereof. In additional aspects, the molded support panel 24 is formed from an opaque material, which in further aspects may be understood as a material that transmits less than 5%, and as low as 0%, of incident electromagnetic waves in the visible range (380 nm to 800 nm) by, e.g., reflecting, absorbing, or scattering the incident electromagnetic waves. In various aspects, the molded support panel 24 provides structural support for the trim panel assembly 22. The molded support panel 24 can be constructed in a variety of different manners and through a variety of different methodologies. In an example, the molded support panel 24 is formed via an extrusion molding process or an injection molding process.

As illustrated, the molded support panel 24 further defines a cavity 38 which includes an opening 40 at the exterior surface 28. The cavity 38 defines an interior volume 42 in which the electronic assembly 12 is located. In aspects, the electronic assembly 12 is received by and disposed at least partially within the cavity 38. The electronic assembly 12 further includes a printed foil 44, a printed circuit board (PCB) 46, a light guide 48, and a reflector 50. The printed foil 44 extends for a first area A1. The printed foil 44 is substantially planar and is sized and shaped to fit within the cavity 38.

More specifically, the printed foil 44 is a thin film of printed material having regions that are at least partially opaque, and separate and distinct regions that are substantially clear or translucent. The printed foil 44 is often colored to match the support panel 24. In an example, the opaque portions of the printed foil 44 are colored black to provide a substantially contiguous and uninterrupted appearance with a black-colored support panel 24. However, it should be appreciated that while black color is described above for both the support panel 24 and the printed foil 44, any other color may be used. Additionally, it should be appreciated that contrasting or complimentary colors of the support panel 24 and the printed foil 44 may be used without departing from the scope or intent of the present disclosure.

The PCB 46 is disposed overtop the printed foil 44. The PCB 46 includes a first face 52, a second face 54, and a side wall 56 joining the first face 52 and the second face 54 at a PCB perimeter 58 of the PCB 46. In some aspects, the faces 52, 54 of the PCB 46 are oblong, and extend for a second area A2 smaller than the first area A1. In some aspects, dimensions of the PCB 46 are defined by opposing longitudinal sides 60, 62 and opposing lateral sides 64, 66. As illustrated, the longitudinal sides 60, 62 exhibit a length L1 that is greater than the length L2 of the lateral sides 64, 66. In an example, the longitudinal length L1 is in the range of 1 cm to 10 cm, including all values and ranges therebetween, and the lateral length L2 is, for example, in the range of 0.5 cm to 5 cm, including all values and ranges therein. However, it should be appreciated that other configurations are contemplated, such as square, ovoid, circular, triangular, or the like. The height L3 of the side wall 67 (or thickness of the PCB 46) is understood to be less than the lengths L1, L2 of either the longitudinal sides 60, 62, and the lateral sides 64, 66. In an example, the height L3 of the side wall 67 may be in the range of 0.5 mm to 3 mm, including all values and ranges therebetween. The PCB 46 may be formed from, e.g., laminate materials including a fabric or paper encapsulated by a resin. The fabric maybe formed from a woven or non-woven material, such as glass fiber or one or more polymer fibers. The encapsulating resin may include, for example, phenolic formaldehyde, epoxy or polyester. Examples of PCBs 46 may include but are not limited to FR1, FR2, FR3, FR4, CEM-1, CEM-3, flex or rigid-flex.

The light guide 48 is used with a light emitting source 68, such as an LED, that is associated with or connected to the PCB 46. The light guide 48 is disposed overtop the PCB 46 and includes a first face 70, a second face 72, and a side wall 74 joining the first and second faces 70, 72 at a light guide perimeter 76. In some aspects, the faces 70, 72 of the light guide 48 are oblong and extend for a third area A3 less than the first area A1 but greater than the second area A2. The light guide perimeter 76 is inset from the printed foil 44 and surrounds the PCB 46. That is, because the third area A3 of the faces 70, 72 of the light guide is greater than the second area A2 but less than the first area A1, the light guide 48 extends beyond the PCB 46, but not quite as far as the printed foil 44. More specifically, the perimeter 76 of the light guide 48 extends three-dimensionally around the PCB 46 and contacts the printed foil 44, thereby forming a sealed interface 78 with the printed foil 44. In an example, the light guide perimeter 76 is inset from the printed foil 44 by a distance W of at least 1 millimeter. In a further example, the light guide perimeter 76 is inset from the printed foil 44 by a distance W of between 1 millimeter and 2.5 millimeters. In still further examples, the light guide perimeter 76 may be inset from the printed foil 44 by a distance W of between 1 and 10 millimeters.

The light guide perimeter 76 has a beveled portion 80. In some aspects, the beveled portion 80 may extend around the entirety of the light guide perimeter 76, or any portion thereof. More specifically, the dimensions of the light guide perimeter 76 vary as between the first and second faces 70, 72 of the light guide 48. That is, the area A3' of the first face 70 of the light guide 48 is smaller than the area A3" of the second face 72 of the light guide 48. Thus, the side wall 74 of the light guide 48 has a slope or bevel in at least in some regions. The sloped or beveled portion 80 of the light guide perimeter 76 results in the light guide 48 having an angular, curvilinear, or similarly sloped cross-sectional shape. The angular or curvilinear cross-section of the beveled portion 80 extends from a lateral edge 82 having a first thickness T1 to an inboard shoulder 84 having a second thickness T2 greater than the first thickness T1. The cross-sectional shape of the light guide perimeter 76 may vary from application to application without departing from the scope or intent of the present disclosure.

As can be seen in the examples of FIGS. 3, 4, and 5 an angle α of the beveled portion 80 relative to the substantially planar molded support panel 24 may vary from application to application without departing from the scope or intent of this disclosure. Furthermore, the angle α in combination with a quantity of force under which the skin layer 30 is injected, define a quantity of force with which the light guide 48 is forced or driven against the printed foil 44 as the semi-transparent material of the skin layer 30 is overmolded directly onto the electronic assembly 12. It should be appreciated that the precise shape and dimensions of the beveled portion 80 may vary substantially from application to application.

Because the beveled portion 80 is oriented towards the injection direction D1 inset from edges of the printed foil 44, the potential for a void, opening, or slit between the light guide perimeter 76 and the printed foil 44 is reduced or substantially eliminated. If the light guide perimeter 76 was not inset from the edges of the printed foil 44, as the skin layer 30 was injected, the skin layer 30 could become incident upon both the light guide perimeter 76 and the printed foil 44 simultaneously. In such a circumstance, any void, opening, slit, or other aperture between the printed foil 44 and the light guide perimeter 76 could then be at least partially opened and the molten skin layer 30 material could enter between the printed foil 44 and the light guide 48. By contrast, when the light guide perimeter 76 is inset from the edge of the printed foil 44 by at least one millimeter, the skin layer 30 material first contacts the printed foil 44, then travels over the light guide perimeter 76. Because the light guide perimeter 76 has a beveled cross section, molten skin layer 30 material is pressed or forced against the printed foil 44 and therefore against the support portion 24 as well. As a result, any void, opening, slit, or other aperture between the printed foil 44 and the light guide perimeter 76 is reduced or substantially eliminated by the force in the second direction D2, rather than allowing the molten skin layer 30 material to infiltrate such an aperture.

When assembled, the light guide 48, the PCB 46, and the printed foil 44 define an air gap 88 located at an outer edge of the PCB 46. The beveled portion 80 of the perimeter 76 of the light guide 48 faces towards the injection direction D1 and defines one or more of a curvilinear cross-section and an angular cross-section. The reflector 50 is disposed overtop the light guide 48 and in conjunction with the light guide 48 directs light emitted by the light emitting source 68 outward relative to the vehicle 10. Thus, light from the light emitting source 68 may be used to display information on or through the skin layer 30 of the trim panel 22. The information may include vehicle status information, vehicle lock status information, a keypad, a fuel level indication, a battery charge indication, or any other such information without departing from the scope or intent of the present disclosure.

In further aspects, the exterior surface 28 of the molded support panel 24 and an exposed portion 86 of the electronic assembly 12 form a continuous surface at the exterior surface 28 of the molded support panel 24. That is, the exterior surface 28 and the exposed portion 86 of the electronic assembly 12 exhibit an air gap 88 therebetween, such as less than 1 mm including all values and ranges from 0.1 mm to 1 mm. The air gap 88 is located at an outer limit 89 of the PCB 46 and separates the PCB 46 slightly from the light guide 48. The air gap 88 provides for manufacturing tolerances, and increases the ease of assembly of the electronic assembly 12, as well as the trim panel 22 as a whole. The cavity 38 may include at least one receiving feature (not specifically shown) that receives at least one locating feature (not specifically shown) of the electronic assembly 12. It may be appreciated that a plurality of locating and receiving features may be provided, such as in the range of 1 to 10 of each feature. The receiving features include, for example, blind holes, and the locating features include, for example, bosses, which form an interference fit between them. Further, the molded support panel 24 defines a channel 92 that accommodates a wire harness 90 coupled to the electronic assembly 12. The wire harness 90 may transmit power, data, or a combination thereof to and from the electronic assembly 12 to one or more controllers (not illustrated) located throughout the vehicle 10. Further, in aspects, the cavity 38 of the molded support panel 24 may conform to the portion of the electronic assembly 12 received in the cavity 38, wherein the surface 92 of the cavity 38 is adjoining, and in further aspects contiguous with, at least a portion of the exterior surface 86 of the electronic assembly 12.

The skin layer 30 is disposed over the molded support panel 24, so that the interior face 32 of the skin layer 30 is disposed adjacent to the exterior surface 28 of the molded support panel 24. In aspects, the skin layer 30 is formed from an at least semi-translucent or semi-transparent material, which may be understood as material that transmits more than 5% of incident electromagnetic waves in the visible range (380 nm to 800 nm), including all values and ranges from 5% to 100%, such as 50% to 99%, with or without (in the case of transparent material) diffusion of the light through the material. In additional or alternative aspects, the skin layer 30 is formed from poly(methyl methacrylate) (PMMA), polycarbonate (PC), polyurea, polyurethane, poly (ether ether ketone) (PEEK), polyetherimide, as well as blends thereof or co-polymers thereof. Further, in aspects, the skin layer 30 conforms to the molded support panel 24 and the portion of the electronic assembly 12 exposed by the cavity 38, wherein the interior face 32 of the skin layer 30 is adjoining, and in further aspects contiguous with, at least a portion of, if not all of, the exterior surface 28 of the molded support panel 24 and the exposed portion 86 of the electronic assembly 12.

In several aspects, the skin layer 30 is disposed over the at least a some of the molded support panel 24 and the electronic assembly 12 by way of an overmolding process. In the overmolding process, the semi-transparent material of the skin layer 30 is overmolded in an injection direction D1 onto the support panel 24 and the electronic assembly 12. More specifically, the overmolding process deposits the skin layer 30 onto the electronic assembly 12 and the support panel through injection molding. In several aspects, the beveled portion 80 of the light guide perimeter 76 faces towards the injection direction D1. Thus, when the semi-transparent skin layer 30 material is overmolded onto the electronic assembly 12, the skin layer 30 is injected in the injection direction D1. The injection direction D1 is substantially parallel to the substantially planar molded support panel 24. Accordingly, molten skin layer 30 material comes into contact with the beveled portion 80 of the light guide perimeter 76. As the molten skin layer 30 material contacts the beveled portion 80, the skin layer 30 exerts force or pressure against the beveled portion 80. The force or pressure is directed in the injection direction D1. However, upon contact with the beveled portion 80, the force or pressure is split into orthogonal components. That is, upon contacting the beveled portion 80 in the injection direction D1, the beveled portion 80 causes the force to have a horizontal component (in the injection direction D1), and a vertical component in a second direction D2 that is substantially orthogonal to the injection direction D1. The force in the second direction D2 presses against the beveled portion 80, and more generally, against the light guide 48, thereby driving the light guide 48 towards the printed foil 44. That is, the force in the second direction D2 reinforces the sealed interface 78 between the light guide 48 and the printed foil 44. The molten skin layer 30 material then travels across and substantially covers the support panel 24 and the electronic assembly 12, thereby sealing the light guide 48 to the printed foil 44 at a predetermined injection pack force. Additionally, because the light guide perimeter 76 extends around and completely surrounds the PCB 46, the entirety of the light guide perimeter 76 is pressed against the printed foil 44 at the predetermined injection pack pressure, thereby sealing the light guide perimeter 76 to the printed foil 44. As discussed earlier, the angle α of the beveled portion 80 relative to the planar support portion 24, and therefore the injection direction D1, may vary from application to application without departing from the scope or intent of this disclosure.

As described herein, when fully assembled the beveled portion 80, and more generally the light guide perimeter 76, seals against the printed foil 44. Accordingly, once the light guide perimeter 76 is sealed against the printed foil 44, as the molten skin layer 30 material is injected, the sealed interface 78 reduces or substantially eliminates the potential for the molten skin layer 30 to infiltrate between the light guide 48 and the printed foil 44. Specifically, the sealed interface 78 eliminates a possible orifice or opening (not shown) facing the injection direction D1, thereby preventing the skin layer 30 from being injected between the light guide 48 and the printed foil 44. Likewise, the sealed interface 78 reduces or substantially eliminates the potential for the molten skin layer 30 to infiltrate between the electronic assembly 12 and the substantially planar molded support panel 24. By preventing the molten skin layer 30 from entering between the electronic assembly 12 and the molded support panel 24, assembly of the trim panel assembly 22 is simplified and quality control may be maintained. Thus, in the fully constructed trim panel assembly 22, the skin layer 30 does not impinge upon or otherwise impede light emitted by the PCB 46 of the electronic assembly 12 from exiting through the printed foil 44.

It should be appreciated that while the trim panel assembly 22 has been described with specific componentry herein, additional components may be present in the assembly without departing from the scope or intent of the present disclosure. For example, the trim panel assembly 22 may include a compression gasket (not specifically shown) between the PCB 46 and the support panel 24, between the printed foil 44 and the light guide perimeter 76, or elsewhere in the assembly. Likewise, an adhesive (not shown) may be used to interconnect and/or seal various components of the trim panel assembly 22 together. The trim panel assembly 22 may also include a liquid polymer resin encapsulating one or more of the components of the electronic assembly 12.

Figure 6:
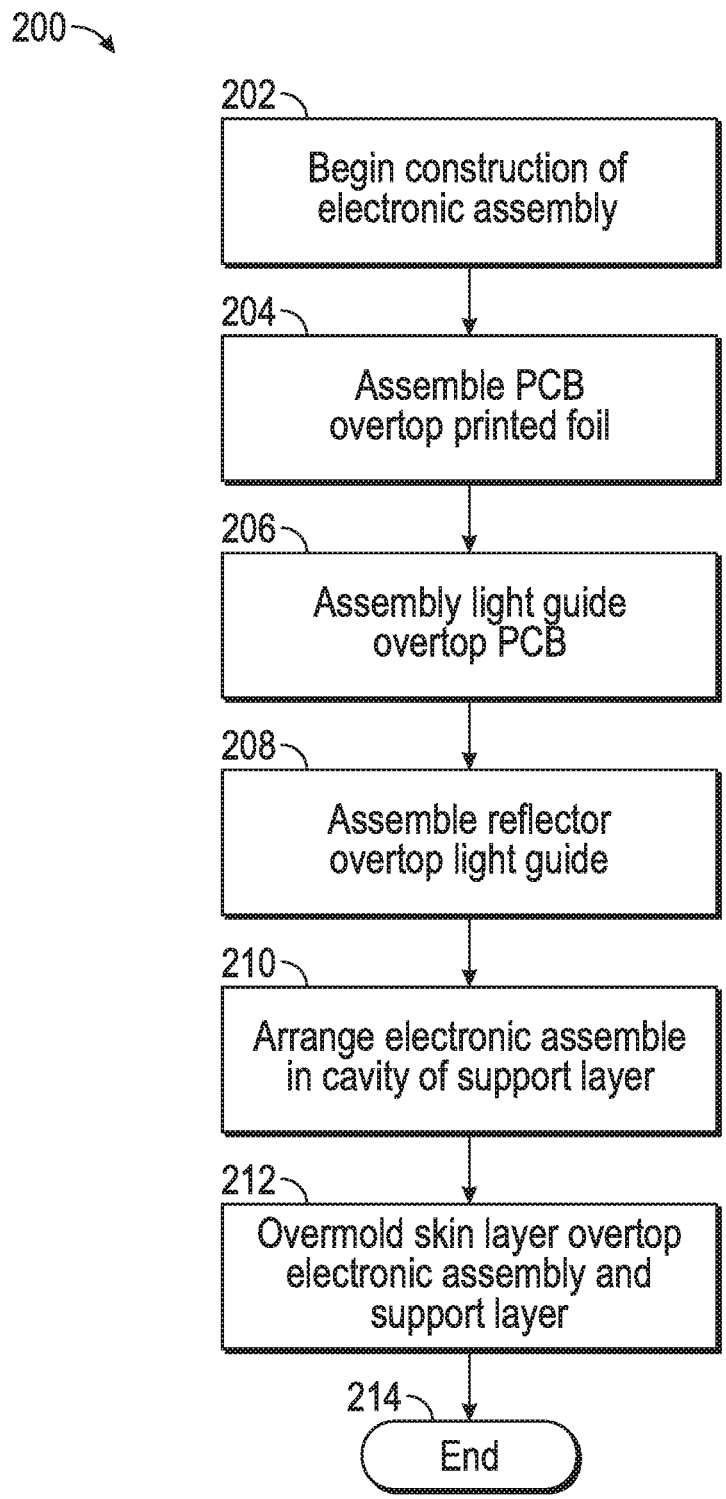
FIG. 6 is a flow chart of a method of constructing a trim panel according to an aspect of the present disclosure.

Turning now to FIG. 6, and with continuing reference to FIGS. 1-5, an exemplary method of forming trim panel assembly 22 is shown and generally indicated by reference number 200. The method 200 begins at block 202 where construction or assembly of the electronic assembly 12 begins. The electronic assembly 12 is constructed or assembled from a plurality of component parts. Specifically, the electronic assembly 12 is assembled from: a printed foil 44, a PCB 46, a light guide 48, and a reflector 50. The printed foil 44 extends for a first area A1.

At block 204, the PCB 46 is assembled overtop the printed foil 44. The PCB 46 includes a first face 52, a second face 54, and a side wall 56 joining the first face 52 and the second face 54 at a PCB perimeter 58 of the PCB 46. In some aspects, the faces 52, 54 of the PCB 46 are oblong, and extend for a second area A2 smaller than the first area A1. In some aspects, dimensions of the PCB 46 are defined by opposing longitudinal sides 60, 62 and opposing lateral sides 64, 66. As illustrated, the longitudinal sides 60, 62 exhibit a length L1 that is greater than the length L2 of the lateral sides 64, 66. In an example, the longitudinal length L1 is in the range of 1 cm to 10 cm, including all values and ranges therebetween, and the lateral length L2 is, for example, in the range of 0.5 cm to 5 cm, including all values and ranges therein.

At block 206, the light guide 48 is assembled overtop the PCB 46 and has a light guide perimeter 76. The light guide perimeter 76 is inset from the printed foil 44 and surrounds the PCB 46. The light guide perimeter 76 forms a sealed interface with the printed foil 44. The light guide perimeter 76 has a beveled portion 80.

At block 208, the reflector 50 is assembled overtop the light guide 48. At block 210, the electronic assembly 12 is arranged within a cavity 38 defined in an exterior surface 28 of a substantially planar molded support panel 24.

At block 212, a semi-transparent material making up the skin layer 30 is overmolded directly onto and overtop the electronic assembly 12 and the substantially planar molded support panel 24. Specifically, the skin layer 30 is overmolded in an injection direction D1. The beveled portion 80 is oriented towards the injection direction D1 and is inset from edges of the printed foil 44 by a distance of at least one millimeter. Additionally, the light guide 48, the PCB 46, and the printed foil 44 define an air gap 88 located at an outer edge of the PCB 46. The beveled portion 80 of the perimeter 76 of the light guide 48 faces towards the injection direction D1 and defines one or more of a curvilinear cross-section and an angular cross-section.

More specifically, at block 212 the semi-transparent skin layer 30 material is injected in the injection direction D1 such that the injection direction D1 is substantially parallel to the substantially planar molded support panel 24. At block 210, molten skin layer 30 material contacts the beveled portion 80 of the perimeter 76 of the light guide 48 as the skin layer 30 material is injected. As the molten skin layer 30 material contacts the beveled portion 80, the skin layer 30 material imparts a force in the injection direction D1. Upon contact with the beveled portion 80, the force generates horizontal and vertical force components. That is, the beveled portion 80 of the perimeter 76 of the light guide 48 generates force in a direction D2 orthogonal to the substantially planar molded support panel 24. The force in the second direction D2 creates the sealed interface 78 between the light guide 48 and the printed foil 44. An angle α of the beveled portion 80 defines a quantity of the force in the second direction D2 generated by the light guide 48 when the semi-transparent material of the skin layer 30 is overmolded onto the electronic assembly 12.

At block 214, the method 200 ends. The method 200 may be repeated for any number of trim panels 22 for a vehicle 10, or for other applications without departing from the scope or intent of the present disclosure.

A trim panel 22 of the present disclosure offers several advantages. These include a simplified construction, reduced cost, and higher accuracy of the system and method of manufacture, leading to a reduced or substantially eliminated incidence of material layers being displaced from their intended locations in the trim panel 22.

The description of the present disclosure is merely exemplary in nature and variations that do not depart form the gist of the present disclosure are intended to be within the scope of the present disclosure. Such variations are not to be regarded as a departure from the spirit and scope of the present disclosure.

What is claimed is:

1. A trim panel assembly, comprising: a printed foil extending for a first area; a printed circuit board disposed overtop the printed foil, the printed circuit board extending for a second area smaller than the first area; a light guide disposed overtop the printed circuit board and having a perimeter, wherein the perimeter of the light guide is inset from the printed foil, and the perimeter of the light guide surrounds the printed circuit board and forms a sealed interface with the printed foil, and wherein at least a portion of the perimeter of the light guide is beveled; a reflector disposed overtop the light guide; and wherein in an electronic assembly the reflector, the light guide, the printed circuit board, and the printed foil are disposed at least partially in a cavity of a molded support panel, wherein the molded support panel is substantially planar, and wherein a semi-transparent material is overmolded directly onto and overtop the electronic assembly and at least some of the molded support panel, wherein the perimeter of the light guide has a beveled portion, wherein when the semi-transparent material is overmolded onto the electronic assembly, the semi-transparent material is injected in a direction substantially parallel the molded support panel, the molded support panel being substantially planar, and the beveled portion of the perimeter of the light guide generates a force in a direction orthogonal to the substantially planar molded support panel, wherein the force creates the sealed interface between the light guide and the printed foil.

2. The trim panel assembly of claim 1 wherein the semi-transparent material is overmolded in an injection direction.

3. The trim panel assembly of claim 1 wherein the beveled portion faces towards the injection direction.

4. The trim panel assembly of claim 1 wherein the beveled portion of the perimeter of the light guide defines a curvilinear cross-section extending from a lateral edge having a first thickness to an inboard shoulder having a second thickness greater than the first thickness.

5. The trim panel assembly of claim 1 wherein the beveled portion of the perimeter of the light guide defines an angular cross-section extending from a lateral edge having a first thickness to an inboard shoulder having a second thickness greater than the first thickness.

6. The trim panel assembly of claim 1 wherein the beveled portion of the perimeter of the light guide is inset from edges of the printed foil by a distance of at least one millimeter.

7. The trim panel assembly of claim 1 wherein the light guide, the printed circuit board, and the printed foil define an air gap located at an outer edge of the printed circuit board.

8. The trim panel assembly of claim 1 wherein an angle of the beveled portion defines a quantity of the force generated by the light guide when the semi-transparent material is overmolded onto the electronic assembly.

9. A trim panel assembly comprising: a molded support panel, the molded support panel including an exterior surface and a cavity defined in the exterior surface; an electronic assembly located in the cavity, the electronic assembly including: a printed foil extending for a first area; a printed circuit board disposed overtop the printed foil, the printed circuit board extending for a second area smaller than the first area; a light guide disposed overtop the printed circuit board and having a perimeter, wherein the perimeter of the light guide is inset from the printed foil, and the perimeter of the light guide surrounds the printed circuit board and forms a sealed interface with the printed foil, and wherein at least a portion of the perimeter of the light guide is beveled; a reflector disposed overtop the light guide; and wherein the molded support panel is substantially planar, and wherein a semi-transparent material is overmolded directly onto and overtop the electronic assembly and at least some of the molded support panel, wherein the perimeter of the light guide includes a beveled portion, wherein the beveled portion faces towards the injection direction, wherein when the semi-transparent material is overmolded onto the electronic assembly, the semi-transparent material is injected in a direction substantially parallel to the molded support panel, the molded support panel being substantially planar, and the beveled portion of the perimeter of the light guide generates force in a direction orthogonal to the molded support panel, the molded support panel being substantially planar, wherein the force creates the sealed interface between the light guide and the printed foil.

10. The trim panel assembly of claim 9 wherein the semi-transparent material is overmolded in an injection direction.

11. The trim panel assembly of claim 9 wherein the beveled portion of the perimeter of the light guide defines one or more of a curvilinear cross-section and an angular cross-section.

12. The trim panel assembly of claim 9 wherein the beveled portion of the perimeter of the light guide is inset from edges of the printed foil by a distance of at least one millimeter.

13. The trim panel assembly of claim 9 wherein the light guide, the printed circuit board, and the printed foil define an air gap located at an outer edge of the printed circuit board.

14. The trim panel assembly of claim 9 wherein an angle of the beveled portion defines a quantity of the force generated by the light guide when the semi-transparent material is overmolded onto the electronic assembly.

15. A method of forming a trim panel assembly, comprising:
assembling an electronic assembly having a printed foil extending for a first area, a printed circuit board (PCB) disposed overtop the printed foil, the PCB extending for a second area smaller than the first area, a light guide disposed overtop the printed circuit board and having a perimeter, wherein the perimeter of the light guide is inset from the printed foil, and the perimeter of the light guide surrounds the PCB and forms a sealed interface with the printed foil, and wherein the perimeter of the light guide includes a beveled portion, and a reflector disposed overtop the light guide;
arranging the electronic assembly within a cavity defined in an exterior surface of a molded support panel, the molded support panel being substantially planar;
overmolding a semi-transparent material directly onto and overtop the electronic assembly and at least some of the molded support panel, and
wherein the semi-transparent material is overmolded in an injection direction, and wherein the beveled portion of the perimeter of the light guide is inset from edges of the printed foil by a distance of at least one millimeter; and the light guide, the PCB, and the printed foil define an air gap located at an outer edge of the printed circuit board; and wherein the beveled portion faces towards the injection direction and defines one or more of a curvilinear cross-section and an angular cross-section.

16. The method of claim 15 overmolding a semi-transparent material further comprises:
injecting the semi-transparent material in a direction substantially parallel to the molded support panel; and
causing the beveled portion of the perimeter of the light guide to generate force in a direction orthogonal to the molded support panel, wherein the force creates the sealed interface between the light guide and the printed foil, and wherein an angle of the beveled portion defines a quantity of the force generated by the light guide when the semi-transparent material is overmolded onto the electronic assembly.

* * * * *